United States Patent
Kondo et al.

(10) Patent No.: US 10,063,229 B2
(45) Date of Patent: Aug. 28, 2018

(54) CONTROLLING A DEVICE BASED ON TOUCH OPERATIONS ON A SURFACE OF THE DEVICE

(71) Applicant: SONY CORPORATION, Tokyo (JP)

(72) Inventors: Yasuhiro Kondo, Tokyo (JP); Yuji Oikawa, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/574,750

(22) Filed: Dec. 18, 2014

(65) Prior Publication Data

US 2015/0188539 A1 Jul. 2, 2015

(30) Foreign Application Priority Data

Dec. 27, 2013 (JP) .................................. 2013-271917

(51) Int. Cl.
| | | |
|---|---|---|
| G06F 3/041 | (2006.01) | |
| H03K 17/96 | (2006.01) | |
| G06F 1/16 | (2006.01) | |
| G06F 3/0354 | (2013.01) | |
| G06F 3/038 | (2013.01) | |

(52) U.S. Cl.
CPC ......... *H03K 17/9625* (2013.01); *G06F 1/169* (2013.01); *G06F 3/038* (2013.01); *G06F 3/03547* (2013.01); *G06F 3/0414* (2013.01); *G06F 2203/04105* (2013.01); *H03K 2217/96015* (2013.01)

(58) Field of Classification Search
CPC ...... H03K 17/9625; H03K 2217/96015; G06F 3/038; G06F 3/041; G06F 3/0354; G06F 1/16

See application file for complete search history.

(56) References Cited

U.S. PATENT DOCUMENTS

| | | | |
|---|---|---|---|
| 2006/0274041 A1* | 12/2006 | Han | G06F 3/0383 345/163 |
| 2008/0266763 A1 | 10/2008 | Tanaka et al. | |
| 2008/0297478 A1* | 12/2008 | Hotelling | G06F 21/32 345/163 |
| 2010/0079404 A1* | 4/2010 | Degner | G06F 3/03547 345/174 |
| 2010/0182167 A1* | 7/2010 | Vanhelle | G06F 3/03547 341/20 |
| 2011/0073382 A1 | 3/2011 | Miyazawa | |
| 2012/0200502 A1* | 8/2012 | Kudrna | G06F 1/1626 345/168 |
| 2013/0300709 A1 | 11/2013 | Arakawa | |
| 2014/0004907 A1* | 1/2014 | Kim | H04M 1/72519 455/566 |

FOREIGN PATENT DOCUMENTS

| | | |
|---|---|---|
| JP | 2008-192012 A | 8/2008 |
| JP | 2008-277874 A | 11/2008 |
| JP | 2011-071738 A | 4/2011 |
| JP | 2013-149126 A | 8/2013 |
| JP | 2013-235359 A | 11/2013 |

\* cited by examiner

*Primary Examiner* — Mark Edwards
(74) *Attorney, Agent, or Firm* — Chip Law Group

(57) ABSTRACT

Provided is a coordinate input device, including: an operation plate that is cantilevered and flexibly supported; a touch sensor that is attached to a rear surface of the operation plate; and a circuit board that is disposed to provide a predetermined gap between the circuit board and the touch sensor and includes a push-in input switch.

9 Claims, 4 Drawing Sheets

CONTROLLING A DEVICE BASED ON TOUCH OPERATIONS ON A SURFACE OF THE DEVICE

CROSS REFERENCE TO RELATED APPLICATIONS

This application claims the benefit of Japanese priority patent application jp 2013-271917 filed on Dec. 27, 2013, the entire contents of which are incorporated herein by reference.

BACKGROUND

The present technology relates to a coordinate input device including a touch sensor.

There has been disclosed a coordinate input device including an operation section that is operable with a finger of a user, with a casing grasped by the user. For example, coordinate input devices including touch sensors as operation sections are disclosed in the following patent documents: Japanese Unexamined Patent Application Publication Nos. 2008-277874, 2011-71738, 2013-149126, 2008-192012, and 2013-235359.

SUMMARY

However, the contents of the patent documents as listed above are silent regarding a relation between load variations according to positions on an operation surface and a state of the finger in operating (such as a state of bending and stretching of the finger). Therefore, further improvement in operability has been desired.

It is desirable to provide a coordinate input device that makes it possible to improve operability.

According to an embodiment of the present technology, there is provided a coordinate input device including: an operation plate that is cantilevered and flexibly supported; a touch sensor that is attached to a rear surface of the operation plate; and a circuit board that is disposed to provide a predetermined gap between the circuit board and the touch sensor and includes a push-in input switch.

In the coordinate input device according to the above-described embodiment of the present technology, the operation plate to which the touch sensor is attached is cantilevered and flexibly supported. This allows a load applied in being pressed near a fixed end of the operation plate to be larger than a load applied in being pressed near a free end of the operation plate. Hence, by adjusting a position of the fixed end in supporting the operation plate, or the like, it is possible to attain, for example, the following operation feelings.

First, assume that a user grasps the casing, where a base of a thumb of the user is located near the fixed end of the operation plate and a tip of the thumb of the user is located near the free end of the operation plate. When the operation plate is pressed near the fixed end by the user, the operation plate is pressed with a bent finger by the user. In this case, it is easy for the user to apply a great pressing force to the operation plate. On the other hand, when the operation plate is pressed near the free end by the user, the operation plate is pressed with a stretched finger by the user. In this case, it is difficult for the user to apply a great pressing force to the operation plate.

Therefore, allowing a necessary pressing force to be smaller as is nearer to the free end of the operation plate may lead to uniformization of sensible easiness of pressing (i.e. feeling of pressing) for the user. Consequently, for example, the fixed end may be disposed at a position where the feeling of pressing is uniformized between when the user presses near the fixed end of the operation plate and when the user presses near the free end of the operation plate.

It is to be noted that, in a case that the operation plate is configured of a plurality of plate pieces that are pressable independently from one another and pressing loads of the respective plate pieces are equal to one another, the following feeling of uncomfortableness in operating is likely to occur. For example, it is difficult to press a plate piece disposed at a position touchable with a tip of a stretched finger, while it is easy to press a plate piece disposed at a position touchable with a tip of a bent finger. That is, the feeling of pressing may vary according to positions.

Moreover, for example, in the coordinate input device according to the above-described embodiment of the present technology, assume that a rarely-used function such as a reset button is provided near the fixed end of the operation plate. In this case, the fixed end may be disposed at a position where a load applied in being pressed near the fixed end of the operation plate is large enough to prevent the user from pressing unintentionally near the fixed end of the operation plate. At this occasion, furthermore, for example, a frequently-used function may be provided near the free end of the operation plate, and the fixed end may be disposed at a position where a load applied in being pressed near the free end of the operation plate is light enough to allow the user to press easily near the free end of the operation plate. The feeling of pressing may also be varied as necessary according to positions.

Moreover, in the coordinate input device according to the above-described embodiment of the present technology, the operation plate is configured of a single plate.

Accordingly, the operation plate has a simpler configuration, as compared to a case that the operation plate is configured of a plurality of plate pieces that are pressable independently from one another. In addition, the operation plate allows a finger to move smoothly over the entire operation surface.

According to the coordinate input device in the above-described embodiment of the present technology, the operation plate to which the touch sensor is attached is cantilevered and flexibly supported. Hence, it is possible to set the feeling of pressing appropriately according to applications, and to allow a finger to move smoothly over the entire operation surface. Consequently, it is possible to attain a coordinate input device having improved operability.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

In the following, some embodiments of the present technology will be described in detail with reference to the accompanying drawings. It is to be noted that description will be made in the following order:
1. Embodiment
2. Modification Example 1. Embodiment

Figure 1:
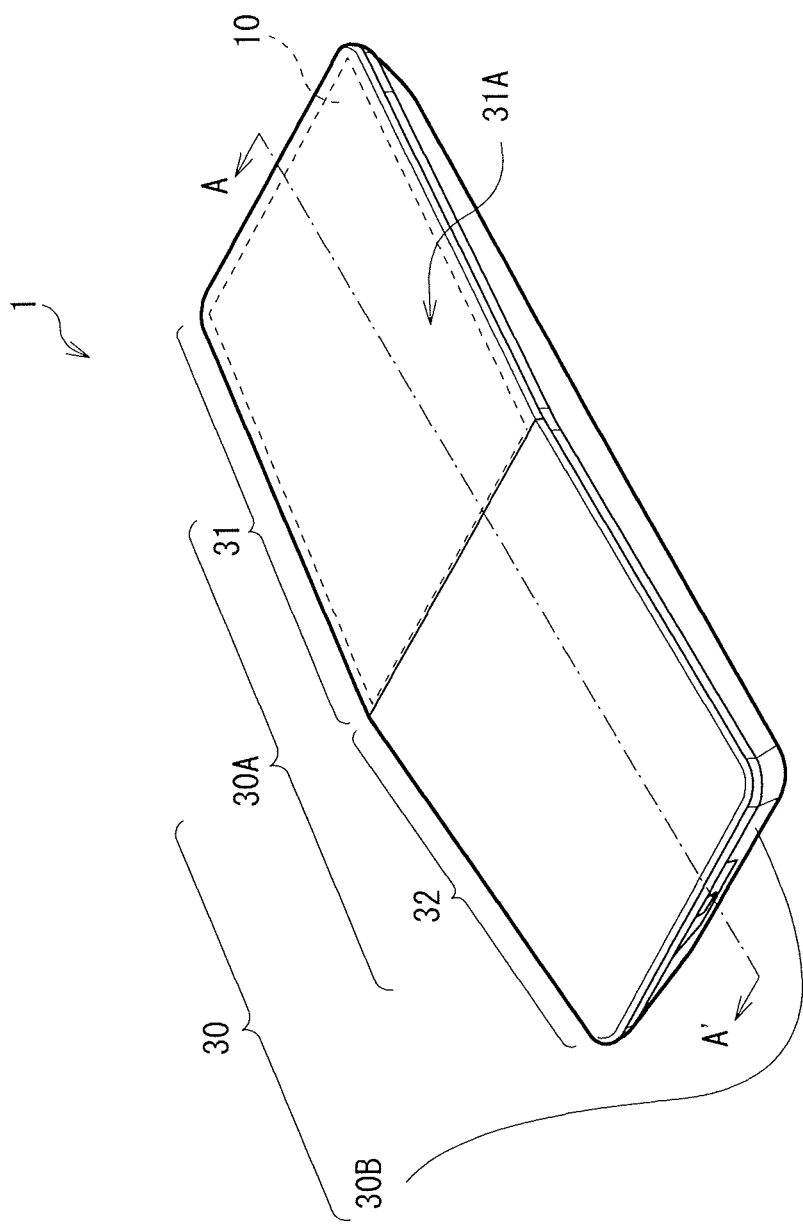
FIG. 1 is a perspective view illustrating a configuration of a coordinate input device according to an embodiment of the present technology.
Figure 2:
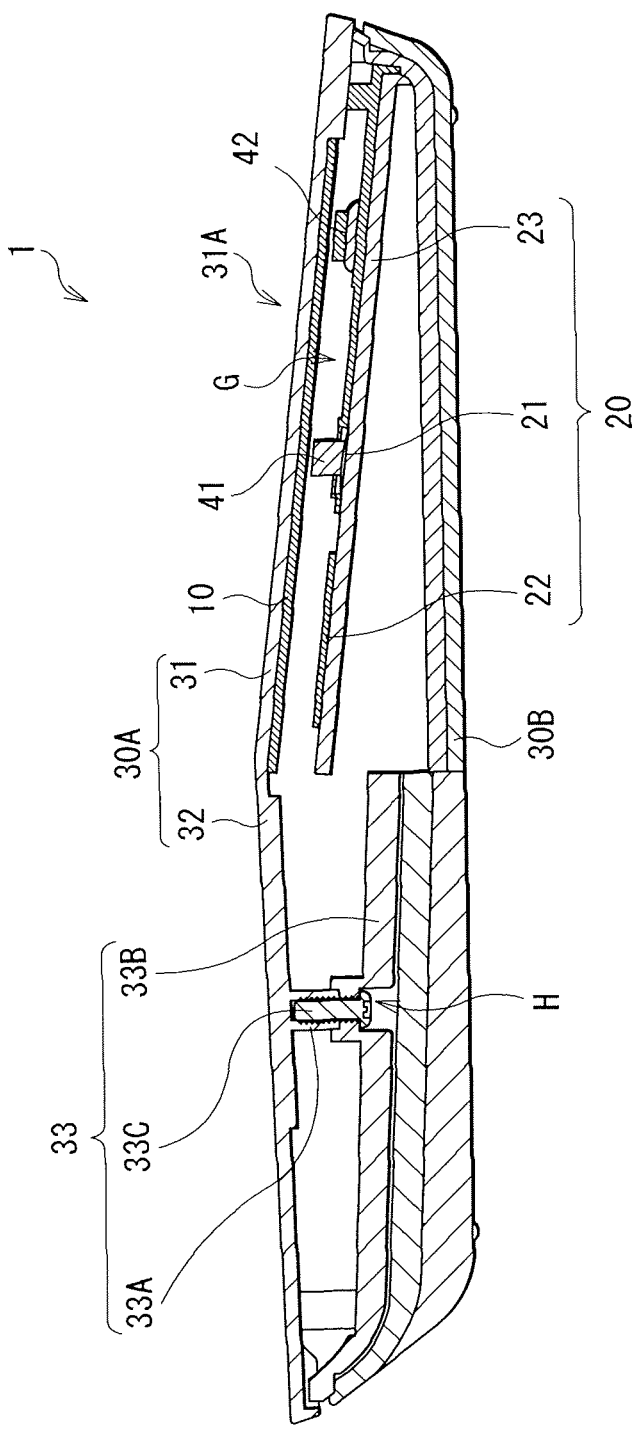
FIG. 2 is a cross-sectional view along a line A-A' of the coordinate input device illustrated in FIG. 1.

[Configuration]
FIG. 1 illustrates a perspective configuration of a remote control device 1 according to an embodiment of the present technology. FIG. 2 illustrates one example of a cross-sectional configuration along a line A-A' of the remote control device 1 illustrated in FIG. 1. The remote control device 1 is one embodiment of a coordinate input device including an operation section that is operable with a finger of a user with a casing grasped by the user. The remote control device 1 may include a touch sensor 10, a circuit board 20, and a casing 30 that is adapted to accommodate the touch sensor 10 and the circuit board 20.

The casing 30 may include an upper cover section 30A and a lower cover section 30B. The touch sensor 10 and the circuit board 20, and the like, are accommodated inside a space formed by the upper cover section 30A and the lower cover section 30B. The casing 30 may include an operation plate 31, a support plate 32, and a starting point forming section 33. The operation plate 31 and the support plate 32 constitute the upper cover section 30A in the casing 30. The upper cover section 30A supports the touch sensor 10, while the lower cover section 30B supports the circuit board 20. There may be provided a predetermined gap G between the touch sensor 10 and the circuit board 20. The casing 30 may have a form that allows a portion including the support plate 32 to be graspable by a user, and may have a shape of, for example, a bar as illustrated in FIG. 1.

The operation plate 31 may be disposed at a position that is touchable with a tip of a thumb of the user, upon grasp of the casing 30 by the user. The support plate 32 may be disposed at a position that is touchable with a base of the thumb of the user, upon grasp of the casing 30 by the user. The operation plate 31 and the support plate 32 may be formed, for example, integrally of a single plate. In this case, of the single plate, a portion that is touchable with the tip of the thumb of the user may correspond to the operation plate 31, while, of the single plate, a portion that is touchable with the base of the thumb of the user may correspond to the support plate 32. In a case that the operation plate 31 and the support plate 32 are formed integrally of a single plate, the single plate itself may be configured of a plate member having flexibility. Examples of the plate member having flexibility may include a thin plate made of a resin.

The operation plate 31 and the support plate 32 may be formed separately from each other with their end portions joined to each other. In this case, the operation plate 31 and the support plate 32 both may be configured of plate members having flexibility. Alternatively, the operation plate 31 may be configured of a plate member having relatively low flexibility, while the support plate 32 may be configured of a plate member having relatively high flexibility.

The operation plate 31 may be cantilevered and flexibly supported by the support plate 32. Therefore, in the operation plate 31, an end portion that is farthest away from the support plate 32 may constitute a free end. A free end refers to an end that is not fixed to other members and is displaceable in a circular arc (or up and down) with a fixed end on the support plate 32 side as a starting point, in response to an external force applied to the end. In other words, the operation plate 31 is configured to allow the user to press the operation plate 31 with the finger downwardly (in a direction toward the lower cover section 30B) or to let the operation plate 31 returned upwardly. Thus, the operation plate 31 is configured to operate like a push-in switch. The support plate 32 is configured to cantilever and flexibly support the operation plate 31. The support plate 32 may be fixed to the lower cover section 30B through the starting point forming section 33. That is, the starting point forming section 33 constitutes a starting point of displacement (the fixed end) in the support plate 32.

The starting point forming section 33 may be disposed at a position that faces the support plate 32 (for example, directly below the support plate 32). In other words, the starting point forming section 33 may be disposed at a position that does not face the touch sensor 10 and is near the position that is touchable with the base of the thumb of the user, upon grasp of the casing 30 by the user. The starting point forming section 33 may be configured of, for example, a female screw section 33A, an intermediate substrate 33B, and a male screw 33C. The female screw section 33A may be provided in a rear surface of the support substrate 32. The intermediate substrate 33B may include an opening H at a position that faces the female screw section 33A. The male screw 33C is configured to be fitted in the female screw section 33A through the opening H. The intermediate substrate 33B may be provided with, for example, a mechanism (not illustrated) that allows the intermediate substrate 33B to be fixed to the lower cover section 30B. It is to be noted that details of a specific position of the starting point forming section 33 will be described later.

The touch sensor 10 is adapted to detect a position that is being touched with a finger of the user on a front surface of the operation plate 31, and to output information on the touched position (i.e. coordinate information) as an electrical signal 10A (a first signal). The touch sensor 10 is attached to a rear surface of the operation plate 31. The touch sensor 10 may include, for example, a region where a touch with a finger is detected (a detection region) whose width is increased as is nearer to the support plate 32. The touch sensor 10 may have a shape of, for example, a trapezoid whose lower base is disposed near the support plate 32. This is based on the following consideration; when the user grasps the casing 30, where the base of the thumb of the user touches the support plate 32 and the tip of the thumb of the user touches the operation plate 31, the thumb of the user has a wider range of movement at a place nearer to the support plate 32 than at a place farthest from the support plate 32. It is to be noted that the touch sensor 10 may be configured to allow the width of the detection region to be constant regardless of positions.

The operation plate 31 may have a shape that is in conformity to a shape of the detection region of the touch sensor 10. In this case, in a case that the detection region of the touch sensor 10 has a trapezoidal shape as mentioned above, the operation plate 31 may also have a trapezoidal shape as mentioned above. Moreover, in a case that the detection region of the touch sensor 10 has a rectangular shape, the operation plate 31 may also have a rectangular shape.

The operation plate 31 may constitute, in the casing 30, an inclined plane 31A descending as is farther away from the support plate 32. An angle formed by the operation plate 31 and the support plate 32 may be, for example, about 6 degrees. This is to allow the thumb to move more naturally and smoothly when the user slides the thumb over a tip portion of the operation plate 31. It is to be noted that the operation plate 31 may be disposed in a same plane as the support plate 32. That is, the angle formed by the operation plate 31 and the support plate 32 may be about 0 degrees.

The circuit board 20 includes a push-in input switch 21. The circuit board 20 may include a processing circuit 22 that is configured to process the electrical signal 10A outputted from the touch sensor 10 and an electrical signal 21A (a second signal) outputted from the input switch 21. The circuit board 20 may further include a wiring base 23. The wiring base 23 supports the input switch 21 and the processing circuit 22 and so on, and may include a wiring that connects the input switch 21 and the processing circuit 22 to each other and a wiring that connects the touch sensor 10 and the processing circuit 22 to each other. For an electrical connection of the touch sensor 10 and the processing circuit 22, for example, an FPC (a flexible printed circuit) may be used. It is to be noted that the processing circuit 22 may be formed in a different substrate from the circuit board 20, and instead of the wiring base 23, there may be provided a substrate that supports the input switch 21.

The input switch 21 is a switch of a push-in type, and is configured to turn on when pressed and to turn off when the pressing is released. The input switch 21 may be disposed, in an upper surface of the circuit board 20, in an opposite region that faces the touch sensor 10. Specifically, the input switch 21 may be disposed, in the above-mentioned opposite region, in a region excluding a first edge and second edge of the circuit board 20; the first edge is nearer to the free end of the operation plate 31 than the second edge; the second edge is nearer to the starting point of displacement than the first edge. One reason is as follows; it is desirable to dispose the input switch 21 at a position that allows the input switch 21 to be easily pressed by the touch sensor 10 when the input switch 21 is pressed by the touch sensor 10. It is to be noted that the remote control device 1 may include, for example, a projected portion 41, at a position that faces the input switch 21, in a rear surface of the touch sensor 10 (a surface on the circuit board 20 side) in order to obtain easiness of pressing the input switch 21. The projected portion 41 may be configured of, for example, rubber.

The processing circuit 22 is adapted, when the input switch 21 is turned on, to generate a signal for wireless communications that corresponds to the coordinate information at the time (the coordinate information obtained from the touch sensor 10), and to output the generated signal to a radiowave transmitter (not illustrated). The processing circuit 22 may or may not generate the signal for wireless communications, when the input switch 21 is off. The processing circuit 22 may be configured of, for example, an IC chip. The radiowave transmitter may be disposed at a tip portion of the remote control device 1. The radiowave transmitter is adapted to generate radiowave based on the inputted signal for wired communications and to output the generated radiowave to the outside.

The touch sensor 10 and the circuit board 20 may be arranged to face each other with the gap G in between. A width (a width in a direction of height) of the gap G may be substantially uniform in a plane when no load is being applied to the upper cover section 30A. In a case that the operation plate 31 constitutes the inclined plane 31A or in a case that the operation plate 31 and the support plate 32 are disposed in the same plane, the width (the width in the direction of height) of the gap G may be substantially uniform in a plane when no load is being applied to the upper cover section 30A.

The remote control device 1 may include a support section 42 that is configured to keep the width of the gap G substantially uniform when no load is being applied to the upper cover section 30A. The support section 42 may be configured to have a thickness equivalent to or larger than a sum of a thickness of the input switch 21 and a height of the projected portion 41 when no external force is applied, and to have a thickness smaller than the above-mentioned sum of the thicknesses when pressed.

(Regarding Position of Starting Point Forming Section 33 (Fixed End))

Figure 3:
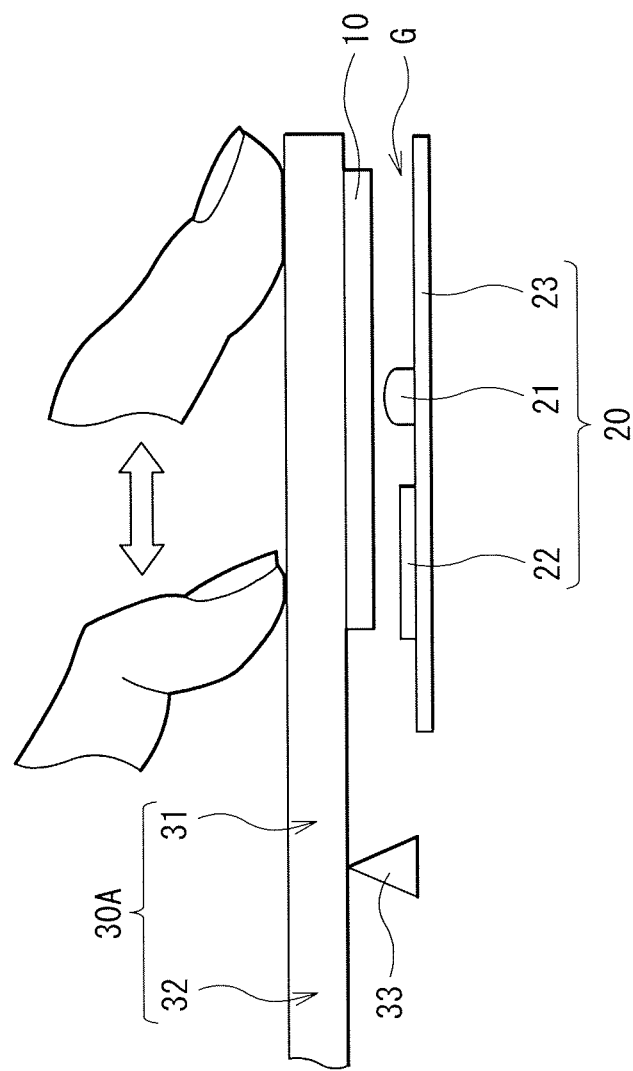
FIG. 3 is a diagram illustrating a state in which the operation plate is pressed with a bent finger or a stretched finger.

The position of the starting point forming section 33 (the fixed end) may be determined, for example, from the following point of view. First, assume that the user grasps the casing 30, where the base of the thumb of the user is located near the fixed end of the operation plate 31 and the tip of the thumb of the user is located near the free end of the operation plate 31. When the operation plate 31 is pressed near the fixed end by the user, the operation plate 31 is pressed, for example, with a bent finger by the user as illustrated on the left side of FIG. 3. In this case, it is easy for the user to apply a great pressing force to the operation plate 31. On the other hand, when the operation plate 31 is pressed near the free end by the user, the operation plate 31 is pressed, for example, with a stretched finger by the user as illustrated on the right side of FIG. 3. In this case, it is difficult for the user to apply a great pressing force to the operation plate 31.

Figure 4:
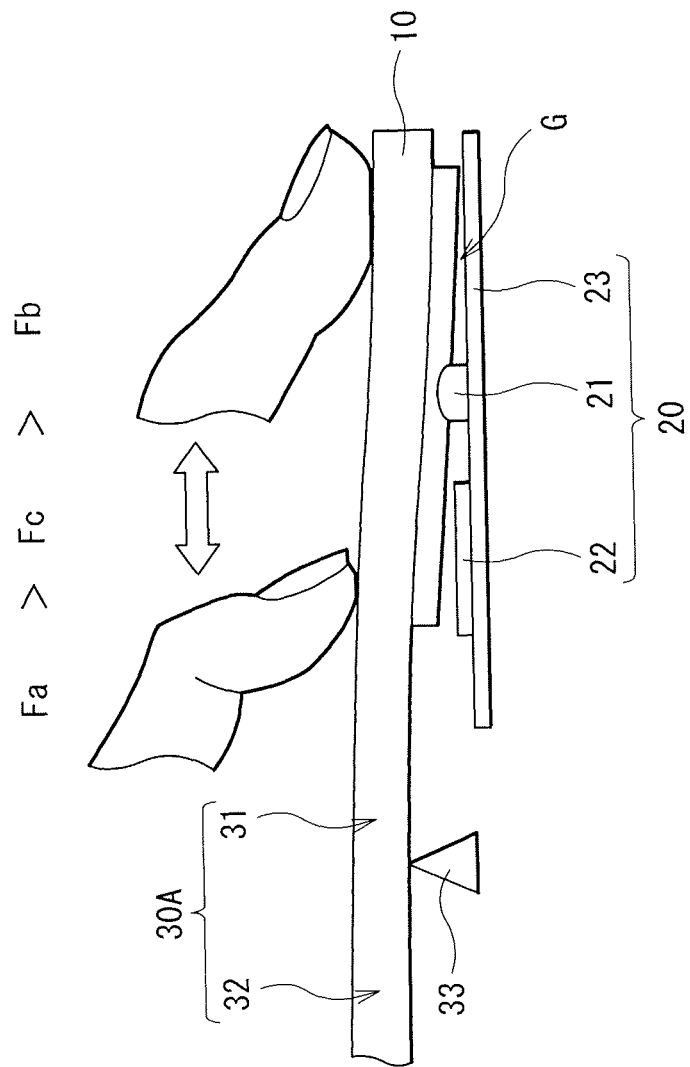
FIG. 4 is a diagram illustrating one example of position dependency of a pressing force necessary to turn on an input switch.

Therefore, for example, as illustrated in FIG. 4, allowing a pressing force necessary to turn on the input switch 21 to be smaller as is nearer to the free end of the operation plate 31 may lead to uniformization of sensible easiness of pressing (i.e. feeling of pressing) for the user. It is to be noted that, in FIG. 4, an example of magnitude relation of a force Fa, a force Fb, and a force Fc is indicated. The force Fa is a necessary force in pressing near the fixed end. The force Fb is a necessary force in pressing near the free end. The force Fc is a necessary force in pressing a region between the fixed end and the free end. Consequently, for example, it is possible to dispose the starting point forming section 33 (the fixed end) at a position where the feeling of pressing is uniformized between when the user presses near the fixed end of the operation plate 31 and when the user presses near the free end of the operation plate 31.

Alternatively, the position of the starting point forming section 33 (the fixed end) may be determined, for example, from the following point of view. For example, assume that a rarely-used function such as a reset button is provided near the fixed end of the operation plate 31. In this case, it is possible to dispose the starting point forming section 33 (the fixed end) at a position where a load applied in being pressed near the fixed end of the operation plate 31 is large enough to prevent the user from pressing unintentionally near the fixed end of the operation plate 31. At this occasion, furthermore, for example, it is possible to provide a frequently-used function near the free end of the operation plate 31, and to dispose the starting point forming section 33 (the fixed end) at a position where a load applied in being pressed near the free end of the operation plate 31 is light enough to allow the user to press easily near the free end of the operation plate 31. In other words, in the remote control device 1, it is also possible to allow the feeling of pressing to vary as necessary according to positions.

[Effects]

Next, description will be given on effects of the remote control device 1 according to the present embodiment.

In the present embodiment, the operation plate 31 to which the touch sensor 10 is attached is cantilevered and flexibly supported. This allows a load applied in being pressed near a fixed end of the operation plate 31 to be larger than a load applied in being pressed near a free end of the operation plate 31. Hence, as described above, by adjusting a position of the fixed end in supporting the operation plate 31, or the like, it is possible to allow the feeling of pressing to be uniform in a plane or to allow the feeling of pressing to vary as necessary according to positions.

It is to be noted that, in a case that the operation plate 31 is configured of a plurality of plate pieces that are pressable independently from one another and pressing loads of the respective plate pieces are equal to one another, the following feeling of uncomfortableness in operating is likely to occur. For example, it is difficult to press a plate piece disposed at a position touchable with a tip of a stretched finger, while it is easy to press a plate piece disposed at a position touchable with a tip of a bent finger. That is, the feeling of pressing may vary according to positions.

Moreover, in the present embodiment, the operation plate 31 is configured of a single plate. Accordingly, the operation plate 31 has a simpler configuration, as compared to a case that the operation plate 31 is configured of a plurality of plate pieces that are pressable independently from one another. In addition, the operation plate 31 allows a finger to move smoothly over the entire operation surface.

As described above, in the present embodiment, it is possible to set the feeling of pressing appropriately according to applications, and to allow a finger to move smoothly over the entire operation surface. Consequently, it is possible to attain a coordinate input device having improved operability.

2. Modification Example

Although description has been made by giving the example embodiment as mentioned above, the contents of the present technology are not limited to the above-mentioned example embodiment and may be modified in a variety of ways. It is to be noted that effects described herein are illustrative and non-limiting. Effects of the present technology are not limited to effects described herein. Effects of the present technology may be other effects or may further include other effects.

For example, in the above-described example embodiment, description has been given on an application of the present technology to a remote control device. However, the present technology may be applied to any coordinate input device as long as the coordinate input device includes an operation section that is operable with a finger of a user, with a casing grasped by the user. For example, the present technology may be applied to, for example, a game controller, or a handle of a vehicle.

It is possible to achieve at least the following configurations from the above-described example embodiments of the disclosure:

(1) A coordinate input device, including:
an operation plate that is cantilevered and flexibly supported;
a touch sensor that is attached to a rear surface of the operation plate; and
a circuit board that is disposed to provide a predetermined gap between the circuit board and the touch sensor and includes a push-in input switch.

(2) The coordinate input device according to (1), further including a casing that accommodates therein the touch sensor and the circuit board,
wherein the casing includes the operation plate, a support plate, and a starting point forming section, the support plate cantilevering and flexibly supporting the operation plate, and the starting point forming section forming a starting point of displacement in the support plate.

(3) The coordinate input device according to (2),
wherein the casing has a form that allows a portion including the support plate to be graspable by a user,
the support plate is disposed at a position that is touchable with a base of a thumb of the user, upon grasp of the casing by the user, and
the operation plate is disposed at a position that is touchable with a tip of the thumb of the user, upon grasp of the casing by the user.

(4) The coordinate input device according to any one of (1) to (3),
wherein the input switch is disposed, in an upper surface of the circuit board, in an opposite region that faces the touch sensor.

(5) The coordinate input device according to (4),
wherein the input switch is disposed, in the opposite region, in a region excluding a first edge and a second edge of the circuit board, the first edge being nearer to a free end of the operation plate than the second edge, and the second edge being nearer to the starting point of displacement than the first edge.

(6) The coordinate input device according to any one of (2) to (5),
wherein the operation plate constitutes, in the casing, an inclined plane descending as is farther away from the support plate, and
the circuit board is disposed to allow a width of the gap to be uniform in a plane.

(7) The coordinate input device according to any one of (2) to (6),
wherein the touch sensor includes a detection region whose width is increased as is nearer to the support plate.

(8) The coordinate input device according to any one of (1) to (7),
wherein the circuit board includes a processing circuit that is configured to process a first signal and a second signal, the first signal being outputted from the touch sensor, and the second signal being outputted from the input switch.

It should be understood by those skilled in the art that various modifications, combinations, sub-combinations and alterations may occur depending on design requirements and other factors insofar as they are within the scope of the appended claims or the equivalents thereof.

What is claimed is:
1. A coordinate input device, comprising:
a support plate;
an operation plate configured to cantilever at a first end of the operation plate,
wherein a second end of the operation plate is configured to displace;
a touch sensor with a first surface attached to a first surface of the operation plate; and a circuit board with a first gap between the circuit board and the touch sensor,
wherein the first gap is associated with a second surface of the circuit board and a second surface of the touch sensor, and
wherein the circuit board comprises:
a push-in input switch configured to be pressed by the second surface of the touch sensor; and
a support member on the second surface of the circuit board, wherein the support member is configured to have a first thickness when the operation plate has no applied external force and the support member is further configured to have a second thickness smaller than the first thickness when the operation plate has the applied external force.

2. The coordinate input device according to claim 1, further comprising:
a casing to accommodate the circuit board in a second gap,
wherein the second gap is between a first cover section of the casing and a second cover section of the casing,
wherein the casing includes the operation plate, the support plate, and a starting point forming section,
wherein the support plate is configured to cantilever the operation plate at the first end, and
wherein the starting point forming section is configured to be a start point of displacement in the support plate.

3. The coordinate input device according to claim 2,
wherein the casing has a shape that allows the casing to be grasped at a portion that includes the support plate,
wherein the support plate is at a first position that is touchable with a base of a thumb of a user, based on grasp of the casing by the user, and
wherein the operation plate is at a second position that is touchable with a tip of the thumb of the user, based on grasp of the casing by the user.

4. The coordinate input device according to claim 3,
wherein the push-in input switch is on the second surface of the circuit board, and
wherein the second surface is associated with an opposite region that faces the touch sensor.

5. The coordinate input device according to claim 4,
wherein the push-in input switch is in a region of the opposite region,
wherein the region excludes a first edge and a second edge of the circuit board,
wherein the first edge is nearer to the second end than the second edge, and
wherein the second edge is nearer to the start point of displacement than the first edge.

6. The coordinate input device according to claim 3,
wherein the operation plate comprises, in the casing, a first plane that descends from the first end to the second end, and
wherein the circuit board is included to allow a width of the first gap to be uniform in a second plane.

7. The coordinate input device according to claim 3,
wherein the touch sensor includes a detection region, and
wherein a width of the detection region increases from the second end to the first end.

8. The coordinate input device according to claim 1,
wherein the touch sensor is configured to output a first signal,
wherein the push-in input switch is further configured to output a second signal, and
wherein the circuit board further comprises a processing circuit configured to process the first signal and the second signal.

9. The coordinate input device according to claim 1, wherein the operation plate is inclined at an angle of 6 degree to the support plate.

* * * * *